United States Patent
Baik et al.

(10) Patent No.: US 10,287,706 B2
(45) Date of Patent: May 14, 2019

(54) HEATING UNIT COMPRISED OF RING HEATERS WITH RING SUPPORT UNITS DISPOSED BETWEEN THE RING HEATERS AND INGOT GROWING DEVICE INCLUDING THE SAME

(71) Applicant: WOONGJIN ENERGY CO., LTD., Daejeon (KR)

(72) Inventors: Sung Sun Baik, Gyeongsangbuk-do (KR); Il Sun Pang, Daejeon (KR); Kwang Hun Kim, Sejong (KR)

(73) Assignee: WOONGJIN ENERGY CO., LTD., Daejeon (KR)

( * ) Notice: Subject to any disclaimer, the term of this patent is extended or adjusted under 35 U.S.C. 154(b) by 0 days.

(21) Appl. No.: 16/072,111

(22) PCT Filed: Nov. 30, 2017

(86) PCT No.: PCT/KR2017/013883
§ 371 (c)(1),
(2) Date: Jul. 23, 2018

(87) PCT Pub. No.: WO2018/101758
PCT Pub. Date: Jun. 7, 2018

(65) Prior Publication Data
US 2019/0032243 A1    Jan. 31, 2019

(30) Foreign Application Priority Data
Nov. 30, 2016 (KR) .......................... 10-2016-0161977

(51) Int. Cl.
*C30B 15/14* (2006.01)
*C30B 15/10* (2006.01)
(Continued)

(52) U.S. Cl.
CPC .............. *C30B 15/10* (2013.01); *C30B 15/14* (2013.01); *C30B 29/06* (2013.01); *C30B 35/00* (2013.01);
(Continued)

(58) Field of Classification Search
CPC ......... C30B 15/00; C30B 15/10; C30B 15/14; C30B 15/20; C30B 29/00; C30B 29/02;
(Continued)

(56) References Cited

U.S. PATENT DOCUMENTS 5,769,944 A * 6/1998 Park ...................... C30B 11/007
117/200
2013/0014695 A1 * 1/2013 Knerer .................... C30B 15/14
117/217

FOREIGN PATENT DOCUMENTS

JP    2001039792    2/2001
JP    4497913       4/2010
(Continued)

OTHER PUBLICATIONS

International Search Report Issued in Corresponding PCT Application No. PCT/KR2017/013883, dated Feb. 22, 2018.

*Primary Examiner* — Kenneth A Bratland, Jr.
(74) *Attorney, Agent, or Firm* — Norton Rose Fulbright US LLP

(57) ABSTRACT

The present invention relates to an ingot growing device for growing a single crystal silicon ingot. According to one embodiment of the present invention, the ingot growing device comprises: a growing chamber having an inner space; a growing container located in the inner space and having a silicon solution accommodated therein; a heating unit encompassing the growing container and located thereat, and generating heat; and a susceptor for supporting the growing container, wherein the heating unit comprises: a first ring heater having a ring shape; a second ring heater
(Continued)

having a ring shape and located at the lower part of the first ring heater; a first coupling part for coupling the first ring heater and the second ring heater; and a first ring support unit located between the first ring heater and the second ring heater and supporting the first ring heater.

8 Claims, 6 Drawing Sheets

(51) Int. Cl.
| | |
|---|---|
| *C30B 29/06* | (2006.01) |
| *F27B 14/06* | (2006.01) |
| *F27B 14/08* | (2006.01) |
| *C30B 35/00* | (2006.01) |
| *H05B 3/10* | (2006.01) |
| *H05B 3/14* | (2006.01) |

(52) U.S. Cl.
CPC .............. *F27B 14/06* (2013.01); *F27B 14/08* (2013.01); *H05B 3/10* (2013.01); *H05B 3/14* (2013.01); *F27B 2014/0825* (2013.01)

(58) Field of Classification Search
CPC ....... C30B 29/06; C30B 35/00; Y10T 117/00; Y10T 117/10; Y10T 117/1016; Y10T 117/1024; Y10T 117/1032; Y10T 117/1068; F27B 14/06; F27B 14/08; F27B 2014/0825; H05B 3/10; H05B 3/14
USPC ... 117/11, 13, 200, 204, 206, 208, 217, 928, 117/931–932
See application file for complete search history.

(56) References Cited

FOREIGN PATENT DOCUMENTS

| KR | 10-1014600 | 2/2011 |
|---|---|---|
| KR | 20130009636 | 1/2013 |
| KR | 20130072770 | 7/2013 |
| KR | 101415374 B1 | 7/2014 |
| KR | 20140094063 | 7/2014 |

\* cited by examiner

HEATING UNIT COMPRISED OF RING HEATERS WITH RING SUPPORT UNITS DISPOSED BETWEEN THE RING HEATERS AND INGOT GROWING DEVICE INCLUDING THE SAME

CROSS-REFERENCE TO RELATED APPLICATIONS

This application is a national phase application under 35 U.S.C. § 371 of International Application No. PCT/KR2017/013883, filed Nov. 30, 2017, which claims priority based on Korean Patent Application No. 10-2016-0161977, filed on Nov. 30, 2016, the contents of which applications are incorporated herein by reference.

TECHNICAL FIELD OF THE DISCLOSURE

The present invention relates to a heating unit provided for a device for manufacturing single-crystalline silicon, and to an ingot growing device for manufacturing single-crystalline silicon using the same.

DESCRIPTION OF RELATED ART

Generally, single-crystalline silicon used for a substrate for manufacturing a semiconductor device is manufactured through a Czochralski (Cz) method. In the Cz method, silicon is put in a quartz crucible, and the crucible is heated to melt the silicon. Then, when the seed crystal is slowly lifted while rotating in contact with a silicon solution, the molten solution is solidified into a solid on a surface of the seed crystal, and an ingot with a predetermined diameter is grown.

The apparatus for manufacturing a single-crystalline ingot using a Cz method includes a growing chamber and a pulling unit allowing a silicon ingot to grow while pulling the silicon ingot. The growing chamber includes a crucible in which the silicon is melted and which accommodates the molten solution, a heater, a heat insulation member, a crucible supporting shaft, and the like. Places at which such the structures are disposed are referred to as Hotzone (H/Z) parts. Most of the H/Z parts are manufactured of graphite, and components of the H/Z part may vary depending on characteristics and manufacturer.

In the process of manufacturing through the Cz method, a heater is disposed around the crucible. Unlike a structure of the conventional heater, a coil type heater is formed by stacking separate ring-shaped heaters, and an upper heater and a lower heater include a connecting portion connecting them. The upper heater and the lower heater are disposed to be spaced by a predetermined distance except for the connecting portion.

However, the structure of the heater has the following problems.

The connecting portion connecting the upper heater with the lower heater has a very small volume relative to the entire volume of the heater. Therefore, sagging may be caused due to a load of the upper heater. The sagging has a structural problem of causing a crack in the heater.

SUMMARY OF THE INVENTION

The present invention is directed to providing a heating unit which increases efficiency of a single-crystalline silicon manufacturing process by stably generating heat, and an ingot growing device including the same.

The research is a research project (No. 20163030013700) supported by Ministry of Trade, Industry, and Energy (MOTIE) and Korea Energy Technology Evaluation and Planning (KETEP).

One aspect of the present invention provides an ingot growing device for growing a single-crystalline silicon ingot.

According to the embodiment of the present invention, the ingot growing device includes a growing chamber including an inner space, a growing container disposed in the inner space and configured to accommodate a silicon solution, a heating unit disposed to surround the growing container and configured to generate heat, and a susceptor configured to support the growing container, wherein the heating unit includes a first ring heater having a ring shape, a second ring heater having a ring shape and disposed below the first ring heater, a first coupling part configured to couple the first ring heater with the second ring heater, and a first ring support unit disposed between the first ring heater and the second ring heater and configured to support the first ring heater.

The first ring support unit may be provided in a $\sqsubset$-shape and may be insertion-coupled to the second ring heater.

The first ring support unit may be provided with a plurality of first ring support units, and the plurality of first ring support units may be spaced apart from the first coupling part by predetermined intervals.

The plurality of first ring support units and the first coupling part may be spaced apart from each other at right angles with respect to a center of the second ring heater.

The heating unit may further include a third ring heater having a ring shape and disposed below the second ring heater, a second coupling part configured to couple the second ring heater with the third ring heater, and a second ring support unit disposed between the second ring heater and the third ring heater, configured to support the second ring heater, and spaced apart from a lower portion of the first ring support unit by a predetermined distance.

The second ring support unit may be provided in a $\sqsubset$-shape and insertion-coupled to the third ring heater, the second ring support unit may be provided with a plurality of second ring support units, and the plurality of second ring support units and the second coupling part may be spaced apart from each other at right angles with respect to a center of the third ring heater.

The first ring support unit and the second ring support unit may be made of a ceramic material.

The ceramic material may be any one of boron nitride, silicon carbide (SiC), alumina ($Al_2O_3$), and silicon nitride ($Si_3N_4$).

Another aspect of the present invention provides a heating unit for generating heat, which is disposed to surround a growing container in which a silicon solution is accommodated in order to grow a single-crystalline silicon.

The heating unit may include a first ring heater having a ring shape, a second ring heater having a ring shape and disposed below the first ring heater, a first coupling part configured to couple the first ring heater with the second ring heater, and a first ring support unit disposed between the first ring heater and the second ring heater and configured to support the first ring heater.

The first ring support unit may be provided in a $\sqsubset$-shape and may be insertion-coupled to the second ring heater.

The first ring support unit may be provided with a plurality of first ring support units, and the plurality of first ring support units and the first coupling part may be spaced apart from each other by predetermined intervals.

The plurality of first ring support units and the first coupling part may be spaced apart from each other at right angles with respect to the second ring heater.

The heating unit may further include a third ring heater having a ring shape and disposed below the second ring heater, a second coupling part configured to couple the second ring heater with the third ring heater, and a second ring support unit disposed between the second ring heater and the third ring heater to support the second heater and spaced apart from a lower portion of the first ring support unit by a predetermined distance.

The second ring support unit may be provided in a ⊏-shape and may be insertion-coupled to the second ring heater, the second ring support unit may be provided with a plurality of second ring support units, and the plurality of second ring support units and the second coupling part may be spaced apart from each other at right angles with respect to a center of the third ring heater.

The first ring support unit and the second ring support unit may be made of a ceramic material, wherein the ceramic material may be any one of boron nitride, silicon carbide (SiC), alumina ($Al_2O_3$), and silicon nitride ($Si_3N_4$).

According to the embodiment of the present invention, a plurality of ring support units are provided between an upper portion of a heating unit and a lower ring heater, and thus sagging of an upper ring heater is prevented or minimized.

Further, according to the embodiment of the present invention, a ring support unit is provided for supporting an upper ring heater, and thus durability of the heating unit can be increased.

BRIEF DESCRIPTION OF THE DRAWINGS

Following drawings of the specification illustrate exemplary embodiments of the present invention and are provided to easily understand the technical spirit of the present invention with detailed descriptions given below. Therefore, the present invention is not limited to only the information illustrated in the drawings.

DETAILED DESCRIPTION OF THE INVENTION

Figure 1:
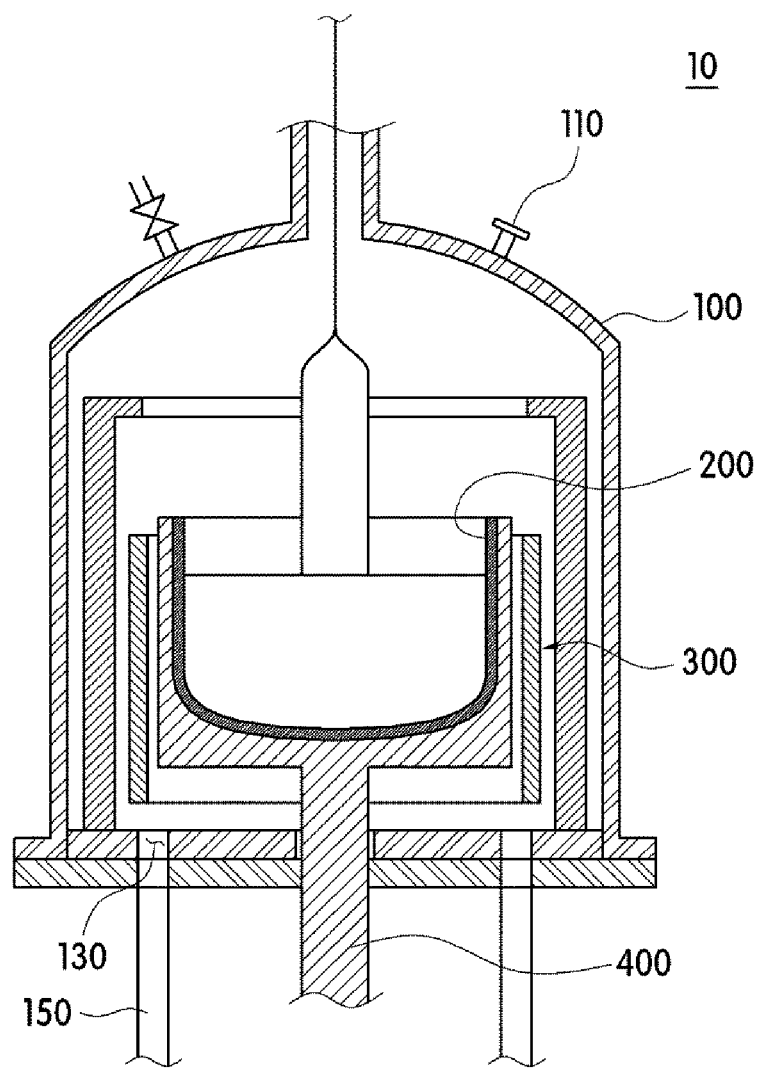
FIG. 1 is a cross-sectional view showing an ingot growing device according to one embodiment of the present invention.

Hereinafter, exemplary embodiments of the present invention will be described in detail with reference to the accompanying drawings. The embodiments of the present invention may be altered in various forms, and the scope of the present invention is not limited to the following embodiments. The embodiments of the present invention are provided for better understanding of the invention to persons having ordinary skill in the art. Accordingly, a shape of an element in the drawing may be exaggerated for explicit comprehension. It should be understood that the terms used in the specification and claims should not be construed as limited to general and dictionary meanings, but should be construed based on the meanings and concepts according to the spirit of the present invention on the basis of the principle that the inventor is permitted to define appropriate terms for optimal explanation.

The present invention provides an ingot growing device 10 which may manufacture single-crystalline silicon. A method of growing an ingot used when single-crystalline silicon is manufactured may use a Czochralski method.

Hereinafter, the ingot growing device 10 according to the embodiment of the present invention will be described.

FIG. 1 is a cross-sectional view showing an ingot growing device according to the embodiment of the present invention.

Referring to FIG. 1, the ingot growing device 10 includes a growing chamber 100, a growing container 200, a susceptor 400, and a heating unit 300.

The growing chamber 100 includes an inner space. The inner space of the growing chamber 100 may be used as a space for growing an ingot. The growing chamber 100 may be provided as an airtight chamber.

The growing chamber 100 may include a gas inlet 110. For example, the gas inlet 110 may be formed on an upper portion of the growing chamber 100. The gas inlet 110 may receive gas from the outside and supply the gas to an inner space. For example, the gas may be inert gas. For example, the inert gas may be argon gas. Unlike the example, the gas may be another inert gas rather than the argon gas.

The gas supplied into the growing chamber 100 removes a silicon-containing compound, which is a foreign material deposited on an inner wall, and discharges the silicon-containing compound to an outlet 130.

The growing chamber 100 may include the outlet 130. The outlet 130 is a path for discharging the silicon containing compound. The outlet 130 may be connected with an external exhaust tube 150.

The growing container 200 may be disposed in the inner space of the growing chamber 100. The growing container 200 may be provided as a container with an open upper portion. The growing container 200 may be made of a graphite material. The growing container 200 may be rotated by the susceptor 400 described below. Molten silicon may be accommodated in the growing container 200. In a state that a seed crystal is immersed in the growing container 200 in which the silicon solution is accommodated, the seed crystal is pulled while the growing container 200 rotates, and thus the ingot may be grown.

The susceptor 400 may rotate while supporting the growing container 200. The susceptor 400 is disposed below the growing container 200 to support the growing container 200. The susceptor 400 is connected to a separate rotating shaft formed thereunder and may be rotated by a device which provides a rotational driving force. For example, the device for providing the rotational driving force may be a motor. Unlike the example, any device that provides a rotational driving force may be used.

Figure 2:
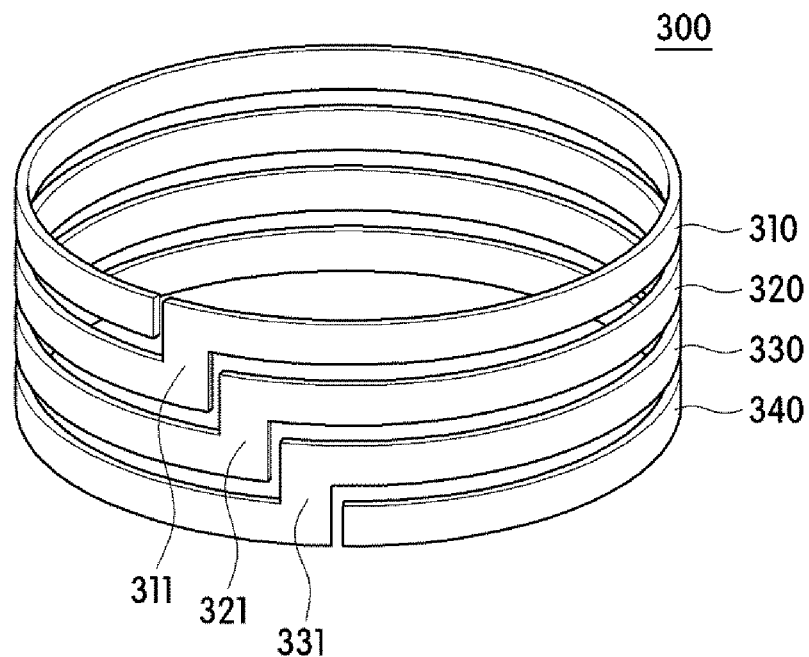
FIG. 2 is a perspective view showing a heating unit according to one embodiment of the present invention.
Figure 3:
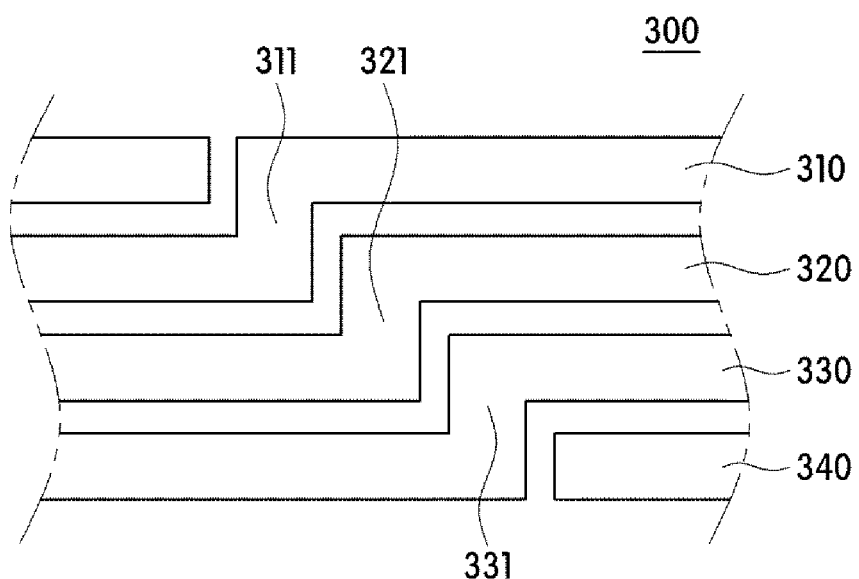
FIG. 3 is a front view showing one part of the heating unit in FIG. 2.
Figure 4:
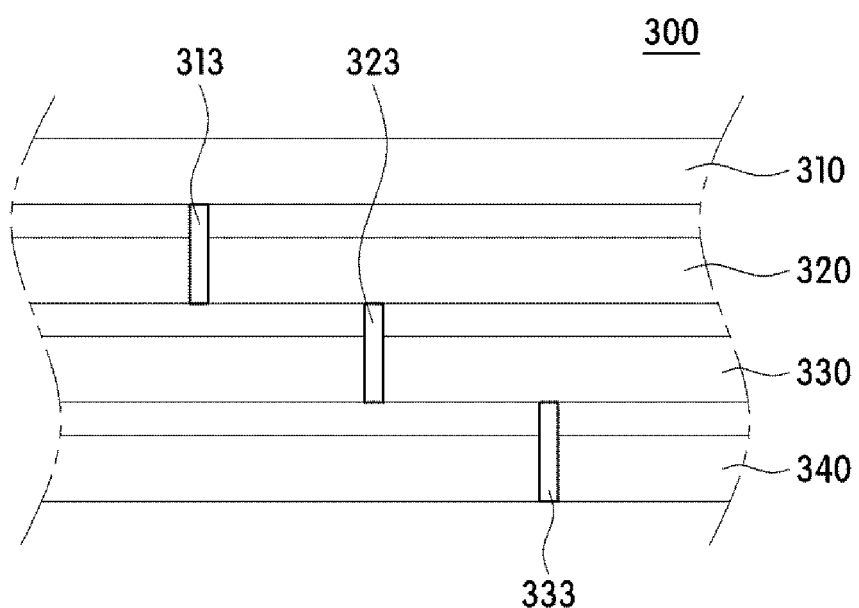
FIG. 4 is a side view showing another part of the heating unit in FIG. 2.

FIG. 2 is a perspective view showing a heating unit according to the embodiment of the present invention, FIG. 3 is a front view showing one part of the heating unit in FIG. 2, and FIG. 4 is a side view showing another part of the heating unit in FIG. 2.

Referring to FIGS. 1 to 4, the heating unit 300 may be disposed to surround the growing container 200. The heating unit 300 may generate heat around the growing container 200. The heating unit 300 may be provided in a form in which a plurality of ring heaters with a ring shape are stacked. The ring heaters of the heating unit 300 may be formed of a material receiving a current from an external power source and generating heat. For example, the ring heaters may be formed of a graphite material. Unlike the description, any material may be applicable without limitations as long as it receives a current and generates heat.

The heating unit 300 includes a first ring heater 310, a second ring heater 320, a third ring heater 330, a fourth ring heater 340, a first coupling part 311, a second coupling part 321, a third coupling part 331, a first ring support unit 313, a second ring support unit 323, and a third ring support unit 333.

The first ring heater 310 may be provided in a ring form. When viewed from above, the first ring heater 310 may have a circular shape as a whole, but the circular shape may be partially cut. For example, one end of the first ring heater 310 may be disposed to be spaced a predetermined distance from the first coupling part 311 described below.

The second ring heater 320 may be disposed below the first ring heater 310. When viewed from above, the second ring heater 320 may have a circular shape as a whole. The second ring heater 320 may have the same size and shape as the first ring heater 310. For example, connection portions of the first coupling part 311 and the second coupling part 321 of the second ring heater 320 described below may be spaced a predetermined distance from each other.

The third ring heater 330 may be disposed below the second ring heater 320. When viewed from above, the third ring heater 330 may have a circular shape as a whole. The third ring heater 330 may have the same size and shape as the first ring heater 310 and the second ring heater 320. For example, connection portions of the second coupling part 321 and the third coupling part 331 of the second ring heater 320 described below may be spaced a predetermined distance from each other.

The fourth ring heater 340 may be disposed below the third ring heater 330. When viewed from above, the fourth ring heater 340 may have a circular shape as a whole. The fourth ring heater 340 may have the same size and shape as the first ring heater 310, the second ring heater 320, and the third ring heater 330. For example, one end of the fourth ring heater 340 may be disposed to be spaced a predetermined distance from the third coupling part 331 described below.

The first coupling part 311 may couple the first ring heater 310 with the second ring heater 320. The first coupling part 311 may be coupled to a part of a lower surface of the first ring heater 310 and a part of an upper surface of the second ring heater 320. For example, a upper portion of the first coupling part 311 is spaced apart from one end of the first ring heater 310. For example, a lower portion of the first coupling part 311 is spaced apart from one end of the second ring heater 330. The first coupling part 311 may be made of the same material as those of the first ring heater 310, the second ring heater 320, the third ring heater 330, and the fourth ring heater 340.

The second coupling part 321 may couple the second ring heater 320 with the third ring heater 330. The second coupling part 321 may be coupled to a part of a lower surface of the second ring heater 320 and a part of an upper surface of the third ring heater 330. When viewed from above, the first coupling part 311 and the second coupling part 321 do not overlap each other and may be spaced a predetermined distance from each other. An upper portion of the second coupling part 321 may be spaced apart from one end of the second ring heater 320. For example, a lower portion of the second coupling part 321 may be spaced apart from one end of the third ring heater 330. The second coupling part 321 may be provided in the same form and shape as that of the first coupling part 311 as a whole. The second coupling part 321 may be made of the same material as those of the first ring heater 310, the second ring heater 320, the third ring heater 330, and the fourth ring heater 340.

The third coupling part 331 may couple the third ring heater 330 with the fourth ring heater 340. The third coupling part 331 may be coupled to a part of a lower surface of the third ring heater 330 and a part of an upper surface of the fourth ring heater 340. When viewed from above, the second coupling part 321 and the third coupling part 331 do not overlap each other and may be spaced a predetermined distance from each other. An upper portion of the third coupling part 331 may be spaced apart from one end of the third ring heater 330. For example, a lower portion of the third coupling part 331 may be spaced apart from one end of the fourth ring heater 340. The third coupling part 331 may be provided in the same form and shape as that of the second coupling part 321 as a whole. The third coupling part 331 may be made of the same material as those of the first ring heater 310, the second ring heater 320, the third ring heater 330, and the fourth ring heater 340.

Figure 5:
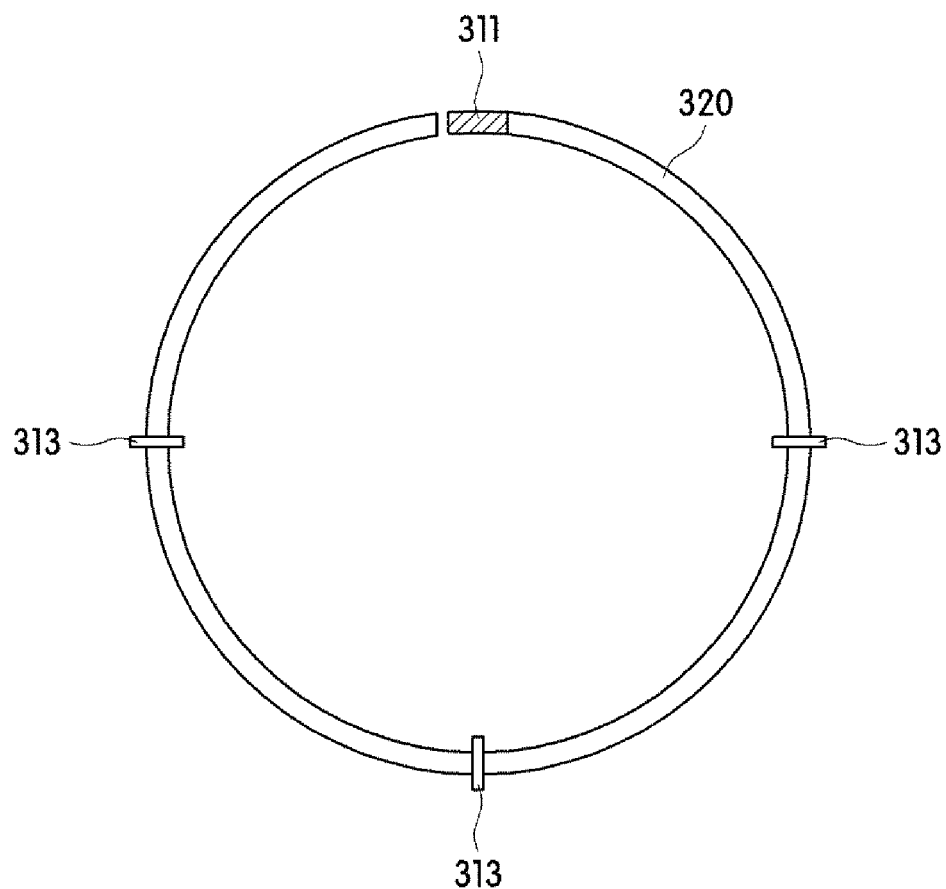
FIG. 5 is a cross-sectional view showing a second ring heater of the heating unit in FIG. 2.
Figure 6:
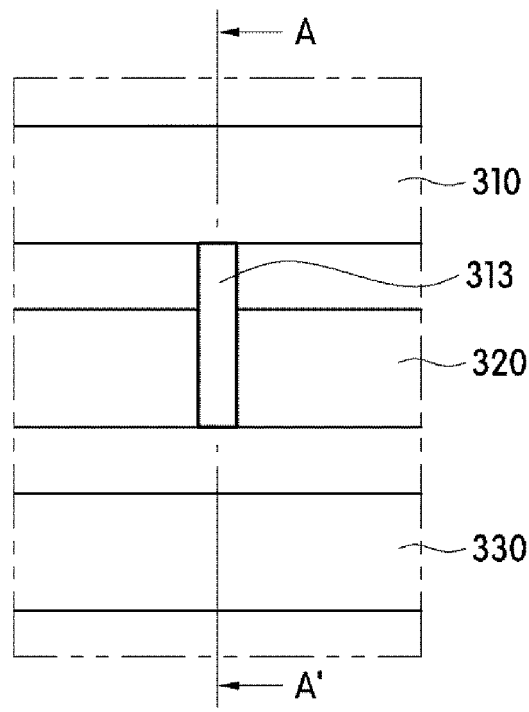
FIG. 6 is a view showing a first ring support unit coupled to a second ring heater.
Figure 7:
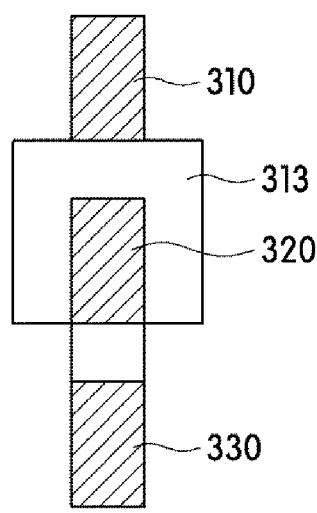
FIG. 7 is a cross-sectional view of the first ring support unit taken along line A-A' in FIG. 6.
Figure 8:
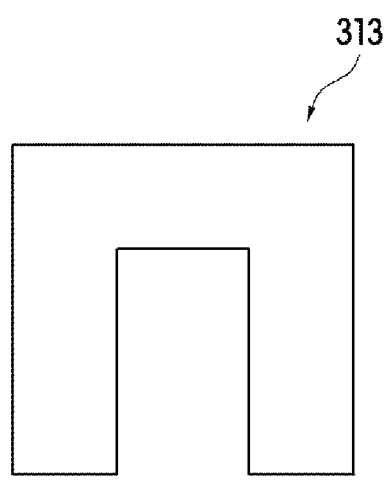
FIG. 8 is a plan view showing a first coupling part.

FIG. 5 is a cross-sectional view showing a second ring heater of the heating unit in FIG. 2, FIG. 6 is a view showing a first ring support unit coupled to a second ring heater, FIG. 7 is a cross-sectional view of the first ring support unit taken along line A-A' in FIG. 6, and FIG. 8 is a plan view showing a first coupling part.

Referring to FIGS. 5 to 8, the first ring support unit 313 may support the first ring heater 310. The first ring support unit 313 may be disposed between the first ring heater 310 and the second ring heater 320. The first ring support unit 313 may be provided in a shape of '⊏'. The first ring support unit 313 may be insertion-coupled to the second ring heater 320. An upper surface of the first ring support unit 313 may be in contact with the first ring heater 310.

A plurality of first ring support units 313 may be provided. The first ring support units 313 may be spaced apart from the first coupling part 311 by predetermined intervals. For example, the first ring support units 313 and the first coupling part 311 may be spaced apart from each other at predetermined angles with respect to a center of the second ring heater 320. For example, as shown in FIG. 5, when the three first ring support units 313 are provided, the three first ring support units 313 and the first coupling part 311 may be spaced apart from each other at predetermined angles with respect to a center of the second ring heater 320. Unlike the above-described example, the first ring support units 313 may be provided in different numbers, and separation angles between the first ring support units 313 and the first coupling part 311 may be different.

The first ring support unit 313 may be made of a material which has high thermal resistance, mechanical strength, corrosion resistance, and electric insulation properties. For example, the first ring support unit 313 may be made of a ceramic material. For example, the first ring support unit 313 may be made of any one of boron nitride, silicon carbide (SiC), alumina ($Al_2O_3$), and silicon nitride ($Si_3N_4$).

The first ring support unit 313 may be insertion-coupled between the first ring heater 310 and the second ring heater 320 to support the first ring heater 310 and may stably support the first ring heater 310 even when sagging of the first ring heater 310 is caused. Further, the plurality of first ring support units 313 are spaced apart from each other at predetermined intervals to evenly support the first ring heater 310 when sagging is caused at upper portions of the first ring support units 313 and may stably support the first ring heater 310 by preventing imbalance of a force applied downward on the first ring heater 310. Further, the first ring support unit 313 may be made of a thermal resistant material to stably support the first ring heater 310 without degradation and breakage even when heat is generated from the first ring heater 310 and the second ring heater 320. Therefore, durability of the heating unit 300 can be increased, and efficiency of the ingot growing process can be increased when the single crystalline silicon is manufactured.

The second ring support unit 323 may support the second ring heater 320. The second ring support unit 323 may be disposed between the second ring heater 320 and the third ring heater 330. The second ring support unit 323 may be provided in a shape of '⊏'. The second ring support unit 323 may be insertion-coupled to the third ring heater 330. An upper surface of the second ring support unit 323 may be in contact with the second ring heater 320.

A plurality of second ring supports units 323 may be provided. The plurality of second ring support units 323 and the second coupling part 321 may be spaced apart from each other by predetermined intervals. For example, the plurality of second ring support units 323 and the second coupling part 321 may be spaced apart from each other at predetermined angles with respect to a center of the third ring heater 330. For example, when three second ring support units 323 are provided, the three second ring support units 323 and the second coupling part 321 may be spaced apart from each other at right angles with respect to a center of the third ring heater 330. Unlike the above-described example, the second ring support units 323 may be provided in different numbers, and separation angles between the second ring support units 323 and the second coupling part 321 may be also different.

The second ring support unit 323 may be made of the same material as the first ring support unit 313. The second ring support unit 323 is made of a material which has high thermal resistance, mechanical strength, corrosion resistance, and electric insulation properties. For example, the second ring support unit 323 may be made of a ceramic material. For example, the second ring support unit 323 may be made of any one of boron nitride, silicon carbide (SiC), alumina ($Al_2O_3$), and silicon nitride ($Si_3N_4$).

The second ring support unit 323 may be insertion-coupled between the second ring heater 320 and the third ring heater 330 to support the second ring heater 320 and may stably support the second ring heater 320 when sagging of the second ring heater 320 is caused. Further, the plurality of second ring support units 323 may be spaced apart from each other at predetermined intervals to evenly support the second ring heater 320 when sagging is caused at upper portions of the second ring support units 323 and may stably support the second ring heater 320 by preventing imbalance of a force applied downward on the second ring heater 320. Further, the second ring support unit 323 may be made of a thermal resistant material to stably support the second ring heater 320 without degradation and breakage even when heat is generated from the second ring heater 320 and the third ring heater 330. Therefore, durability of the heating unit 300 can be increased, and efficiency of the ingot growing process can be increased when the single crystalline silicon is manufactured.

The third ring support unit 333 may support the third ring heater 330. The third ring support unit 333 may be disposed between the third ring heater 330 and the fourth ring heater 340. The third ring support unit 333 may be provided in a '⊏'-shape. The third ring support unit 333 may be insertion-coupled to the fourth ring heater 340. An upper surface of the third ring support unit 333 may be in contact with the third ring heater 330.

A plurality of third ring supports units 333 may be provided. The plurality of third ring support units 333 and the third coupling part 331 may be spaced apart from each other by predetermined intervals. For example, the plurality of third ring support units 333 and the second coupling part 321 may be spaced apart from each other at predetermined angles with respect to a center of the fourth ring heater 340. For example, when three third ring support units 333 are provided, the three third ring support units 333 and the third coupling part 331 may be spaced apart from each other at right angles with respect to a center of the fourth ring heater 340. Unlike the above-described example, the third ring support units 333 may be provided in different numbers, and separation angles between the third ring support units 333 and the third coupling part 331 may be also different.

The third ring support unit 333 may be made of the same material as the first ring support unit 313 and the second ring support unit 323. The third ring support unit 333 may be made of a material which has high thermal resistance, mechanical strength, corrosion resistance, and electric insulation properties. For example, the third ring support unit 333 may be made of a ceramic material. For example, the third ring support unit 333 may be made of any one of boron nitride, silicon carbide (SiC), alumina ($Al_2O_3$), and silicon nitride ($Si_3N_4$).

The third ring support unit 333 may be insertion-coupled between the third ring heater 330 and the fourth ring heater 340 to support the third ring heater 330 and may stably support the third ring heater 330 even when sagging of the third ring heater 330 is caused. Further, the plurality of third ring support units 333 may be spaced apart from each other at predetermined intervals to evenly support the third ring heater 330 when sagging is caused at upper portions of the third ring support units 333 and may stably support the third ring heater 330 by preventing imbalance of a force applied downward on the third ring heater 330. Further, the third ring support unit 333 may be made of a thermal resistant material to stably support the third ring heater 330 without degradation and breakage even when heat is generated from the third ring heater 330 and the fourth ring heater 340. Therefore, durability of the heating unit 300 can be increased, and efficiency of the ingot growing process can be increased when the single crystalline silicon is manufactured.

As described before, according to the embodiment of the present invention, the ring support units are provided between the ring heaters of the heating unit 300 to stably support the ring heaters at upper portions thereof, and thus increases durability of the heating unit 300. Further, the efficiency of the ingot growing process can be increased.

In the above-described example, the heating unit 300 includes four ring heaters including the first ring heater 310, the second ring heater 320, the third ring heater 330, and the fourth ring heater 340, and three ring support units including the first ring support unit 313, the second ring support unit 323, the third ring support unit 333, but the heating unit and the ring support units are not limited thereto and may be provided in plural numbers.

The above-described detailed descriptions illustrate the exemplary embodiments of the present invention. Further, the above description describes exemplary embodiments of the present invention, but the present invention may be used in various combinations, changes, and environments. That is, changes or modifications may be made within a range of a concept of the present invention disclosed in the specification, a range equivalent to the disclosure, and/or a range of technology or knowledge in the art. The above-description is for describing the best state to embody the technological scope of the present invention, and various changes required for a specific applicable field and uses of the present invention may be possible. Therefore, the above-described detailed descriptions of the present invention are not limited to the disclosed embodiments. Further, it should be interpreted that the appended claims include other embodiments.

The invention claimed is:

1. An ingot growing device for growing a single-crystalline silicon ingot, the device comprising:
  a growing chamber including an inner space;
  a growing container disposed in the inner space and configured to accommodate a silicon solution;
  a heating unit disposed to surround the growing container and configured to generate heat; and
  a susceptor configured to support the growing container, wherein the heating unit includes:
  a first ring heater having a ring shape;
  a second ring heater having a ring shape and disposed below the first ring heater;
  a first coupling part configured to couple the first ring heater with the second ring heater;
  a first ring support unit disposed between the first ring heater and the second ring heater and configured to support the first ring heater;
  a third ring heater having a ring shape and disposed below the second ring heater;
  a second coupling part configured to couple the second ring heater with the third ring heater; and
  a second ring support unit disposed between the second ring heater and the third ring heater, configured to support the second ring heater, and spaced apart from a lower portion of the first ring support unit by a predetermined distance,
  wherein the first ring support unit is provided in a ⊏-shape and insertion-coupled to the second ring heater,
  the first ring support unit is provided with a plurality of first ring support units,
  the plurality of first ring support units and the first coupling part are spaced apart from each other by predetermined intervals,
  the second ring support unit is provided in a ⊏-shape and insertion-coupled to the third ring heater,
  the second ring support unit is provided with a plurality of second ring support units, and the plurality of second ring support units and the second coupling part are spaced apart from each other by predetermined intervals, and
  the first ring support unit and the second ring support unit are made of a ceramic material.

2. The device of claim 1, wherein the plurality of first ring support units and the first coupling part are spaced apart from each other at right angles with respect to a center of the second ring heater.

3. The device of claim 1, wherein:
  the plurality of second ring support units and the second coupling part are spaced apart from each other at right angles with respect to a center of the third ring heater.

4. The device of claim 1, wherein the ceramic material is provided with any one of boron nitride, silicon carbide (SiC), alumina ($Al_2O_3$), and silicon nitride ($Si_3N_4$).

5. A heating unit for generating heat, which is disposed to surround a growing container in which a silicon solution is accommodated in order to grow a single-crystalline silicon, the heating unit comprising:
  a first ring heater having a ring shape;
  a second ring heater having a ring shape and disposed below the first ring heater;
  a first coupling part configured to couple the first ring heater with the second ring heater;
  a first ring support unit disposed between the first ring heater and the second ring heater and configured to support the first ring heater;
  a third ring heater having a ring shape and disposed below the second ring heater;
  a second coupling part configured to couple the second ring heater with the third ring heater; and
  a second ring support unit disposed between the second ring heater and the third ring heater to support the second heater and spaced apart from a lower portion of the first ring support unit by a predetermined distance,
  wherein the first ring support unit is provided in a ⊏-shape and is insertion-coupled to the second ring heater,
  the first ring support unit is provided with a plurality of first ring support units,
  the plurality of first ring support units and the first coupling part are spaced apart from each other by predetermined intervals,
  the second ring support unit is provided in a ⊏-shape and is insertion-coupled to the third ring heater,
  the second ring support unit is provided with a plurality of second ring support units,
  the plurality of second ring support units and the second coupling part are spaced apart from each other by predetermined intervals, and
  the first ring support unit and the second ring support unit are made of a ceramic material.

6. The heating unit of claim 5, wherein the plurality of first ring support units and the first coupling part are spaced apart from each other at right angles with respect to the second ring heater.

7. The heating unit of claim 5, wherein:
  the plurality of second ring support units and the second coupling part are spaced apart from each other at right angles with respect to a center of the third ring heater.

8. The heating unit of claim 5, wherein the first ring support unit and the second ring support unit are made of a ceramic material, wherein the ceramic material is any one of boron nitride, silicon carbide (SiC), alumina ($Al_2O_3$), and silicon nitride ($Si_3N_4$).

* * * * *